(12) United States Patent
Wuppermann (10) Patent No.: US 6,956,402 B2
(45) Date of Patent: Oct. 18, 2005

(54) MULTI-DEVICE SYSTEM AND METHOD FOR CONTROLLING VOLTAGE PEAKING OF AN OUTPUT SIGNAL TRANSMITTED BETWEEN INTEGRATED CIRCUIT DEVICES

(75) Inventor: Bernd Wuppermann, Pacifica, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 140 days.

(21) Appl. No.: 10/354,400

(22) Filed: Jan. 30, 2003

(65) Prior Publication Data

US 2004/0150424 A1 Aug. 5, 2004

(51) Int. Cl.[7] ............................................. H03K 19/094
(52) U.S. Cl. ............................ 326/82; 326/83; 326/30; 326/90
(58) Field of Search ............................ 326/30, 62, 82, 326/83, 86, 90

(56) References Cited

U.S. PATENT DOCUMENTS

| | | | |
|---|---|---|---|
| 4,016,481 A | | 4/1977 | Bradley |
| 5,852,540 A | * | 12/1998 | Haider ........................ 361/111 |
| 6,114,876 A | * | 9/2000 | Kwong et al. ................. 326/81 |
| 6,198,309 B1 | | 3/2001 | Smetana |
| 2003/0098714 A1 | * | 5/2003 | Clark et al. .................... 326/86 |

* cited by examiner

Primary Examiner—Anh Q. Tran (57) ABSTRACT

A multi-device system and method for controlling voltage peaking of an output signal transmitted between input and output circuits of integrated circuit devices utilizes various electrical elements that can be adjusted after the fabrication of the integrated circuit devices to change the impedance of the input and output circuits. These adjustable electrical elements include one or more pass transistors in the input circuit whose on-resistances can be changed by adjusting a control signal supplied to the pass transistors. The adjustable electrical elements may also include one or more of the following: an adjustable current source, an adjustable resistor and a resistance-adjustable transistor operated as an adjustable resistor.

17 Claims, 3 Drawing Sheets

MULTI-DEVICE SYSTEM AND METHOD FOR CONTROLLING VOLTAGE PEAKING OF AN OUTPUT SIGNAL TRANSMITTED BETWEEN INTEGRATED CIRCUIT DEVICES

FIELD OF THE INVENTION

The invention relates generally to integrated circuits, and more particularly to interfaces of integrated circuit devices.

BACKGROUND OF THE INVENTION

Integrated circuit (IC) devices of a system are typically interfaced using input and output circuits. The output circuit of one IC device is used to drive the input circuit of another IC device, which is usually dominated by capacitance. The connection between the IC devices can consist of bondwires and/or short ($\ell \ll \lambda/4$) transmission lines, which are usually inductive. For such an interface the following equations apply:

$$R_D \cong \frac{1}{2\pi BW C_L}, R_D \ll \sqrt{\frac{L}{C_L}}, R_L \gg \sqrt{\frac{L}{C_L}} \text{ and } f_{res} \cong \frac{1}{2\pi\sqrt{LC_L}},$$

where $R_D$ is the resistance of the output circuit, BW is the bandwidth, $C_L$ is the load capacitance of the input circuit, $R_L$ is the load resistance of the input circuit, L is the inductance of the device-to-device connection and $f_{res}$ is the LC-resonance frequency.

In many wideband applications, a flat or very low voltage peaking frequency response with maximum bandwidth is desired. However, the interfaced IC devices will have a LC-resonance at $f_{res}$. Even though the system bandwidth may be determined by the output circuit and be smaller than $f_{res}$, the transfer function of the overall system can suffer from considerable peaking due to the inductive resonance of the interface. The amount of peaking is determined by the quality factor Q, which can be expressed as:

$$Q \sim \frac{1}{(1/Q_L + 1/Q_C)} \text{ with } Q_L = \frac{\omega L}{R_D} \text{ and } Q_C = R_L \cdot \omega C_L.$$

Existing methods of high speed device-to-device connections to control peaking involve selecting $R_D$ and $R_L$ such that $R_L$, $R_D \cong Z_L$, where $Z_L = \sqrt{L/C_L}$, based on the termination of transmission lines. However, the use of these methods reduces the achievable bandwidth if $R_D$ is increased, or reduces the signal amplitude if $R_L$ is decreased to $Z_L$. Furthermore, $R_D$, $R_L$ and $C_L$ are subject to process variations of integrated circuit technology. Thus, the selecting of $R_D$ and $R_L$ to control peaking with predictable results is a difficult task due to the process variations.

In light of these concerns, what is needed is a multi-device system and method for controlling voltage peaking of an output signal transmitted between interfaced IC devices without significantly reducing the achievable bandwidth and/or the signal amplitude, while taking into consideration process variations.

SUMMARY OF THE INVENTION

A multi-device system and method for controlling voltage peaking of an output signal transmitted between input and output circuits of integrated circuit (IC) devices utilizes various electrical elements that can be adjusted after the fabrication of the IC devices to change the impedance of the input and output circuits. These adjustable electrical elements include one or more pass transistors in the input circuit whose on-resistances can be changed by adjusting control signals supplied to the pass transistors. The adjustable electrical elements may also include one or more of the following: an adjustable current source, an adjustable resistor and a resistance-adjustable transistor operated as an adjustable resistor.

A multi-device system in accordance with one embodiment of the invention comprises a first IC device including an output circuit and a second IC device including an input circuit. The output circuit is electrically connected to the input circuit to transmit an output signal to the input circuit. The input circuit includes an input node, a pass transistor and an adjustable voltage source. The input node is connected to the output circuit of the first IC device to receive the output signal. The pass transistor is connected to the input node. The pass transistor has a control electrode, which is connected in series with the adjustable voltage source to receive a control signal. The adjustable voltage source is configured to adjust the control signal to change the on-resistance of the pass transistor. The change in the on-resistance of the pass transistor affects the impedance of the input circuit, which in turn affects the voltage peaking of the output signal transmitted from the output circuit to the input circuit.

A method of controlling voltage peaking of an output signal transmitted between IC devices in accordance with one embodiment of the invention comprises providing an input circuit including a pass transistor connected in series between an input node and a low voltage terminal, and adjusting a control signal applied to the pass transistor of the input circuit to change the on-resistance of the pass transistor, which affects the voltage peaking of the output signal transmitted from the output circuit to the input node of the input circuit.

Other aspects and advantages of the present invention will become apparent from the following detailed description, taken in conjunction with the accompanying drawings, illustrated by way of example of the principles of the invention.

DETAILED DESCRIPTION

Figure 1:
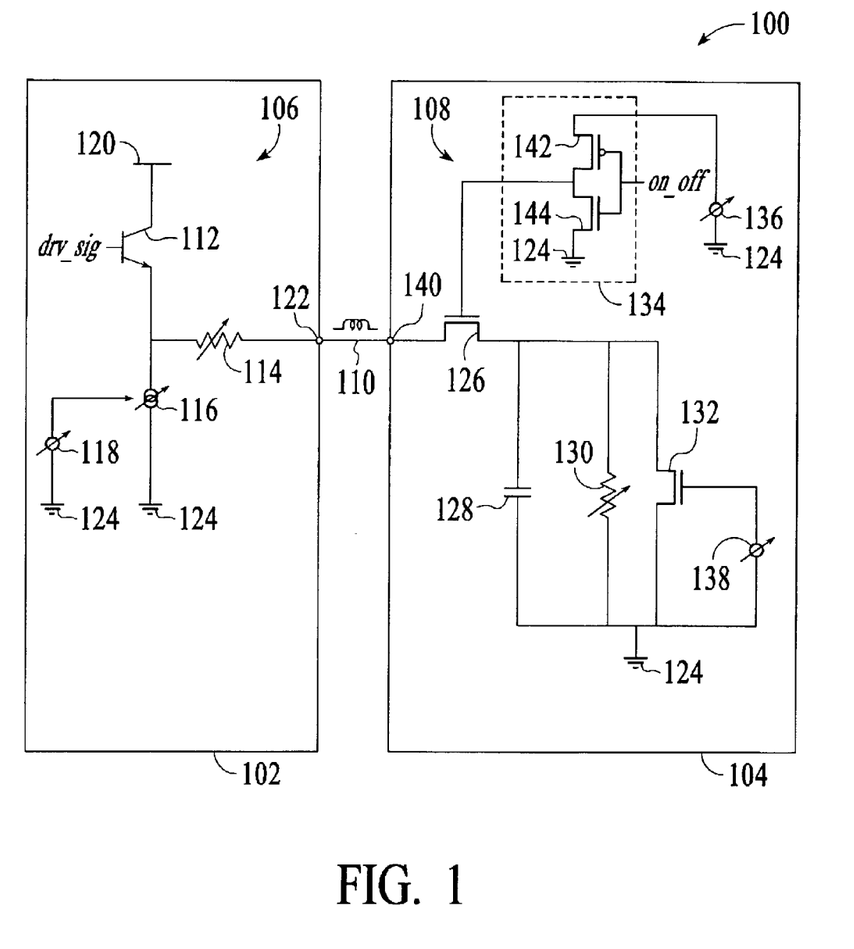
FIG. 1 is a diagram of a multi-device system in accordance with one embodiment of the present invention.

With reference to FIG. 1, a multi-device system 100 having an integrated circuit (IC) device 102 and an IC device 104 in accordance with one embodiment of the invention is shown. The IC devices 102 and 104 may be semiconductor chips. The IC device 102 includes an output circuit 106, while the IC device 104 includes an input circuit 108, which is driven by an output signal transmitted from the output circuit. The IC devices 102 and 104 are interfaced by an electrical connection 110, which connects the output circuit 106 of the IC device 102 and the input circuit 108 of the IC device 104. The electrical connection 110 may be a bondwire and/or a short ($\ell \ll \lambda/4$) transmission line. As indicated in FIG. 1, the electrical connection 110 is inductive, which can cause significant peaking due to inductive resonance. The output and input circuits 106 and 108 are designed such that the respective impedances can be adjusted after fabrication of the IC devices 102 and 104 so that voltage peaking due to the interface of the IC devices can be controlled.

The output circuit 106 of the IC device 102 includes a driving transistor 112, an optional adjustable resistor 114, an adjustable current source 116 and an adjustable voltage source 118. The driving transistor 112 is a bipolar transistor, which is configured as an emitter follower. Thus, the collector of the driving transistor 112 is connected to a high voltage terminal (e.g., supply voltage terminal), and the emitter of the transistor is connected to an output node 122 via the optional adjustable resistor 114. The emitter of the driving transistor 112 is also connected to the adjustable current source 116. In other embodiments, the driving transistor 112 may be another type of transistor, such as a Field Effect Transistor (FET) or a Complementary Metal Oxide Semiconductor (CMOS) transistor. The output node 122 is connected to the electrical connection 110. The base of the driving transistor 112 is configured to receive a driving signal, drv_sig, which controls (increases and decreases) the current conducted through the driving transistor 112. Thus, the driving signal determines the output signal transmitted from the output circuit 106 to the input circuit 108 to drive the input circuit.

The adjustable current source 116 is connected in series between the emitter of the driving transistor 112 and a low voltage terminal 124, e.g., ground. The adjustable current source 116 is controlled by a control voltage from the adjustable voltage source 118. The current drawn by the adjustable current source 116 depends on the control voltage. Thus, the current drawn by the adjustable current source 116 can be adjusted by varying the control voltage from adjustable voltage source 118. Consequently, in contrast to fixed current sources, the current drawn by the adjustable current source 116 can be adjusted after fabrication of the IC device 102 to control voltage peaking of the transmitted output signal, as described below. As an example, the adjustable current source 16 may be a bipolar transistor, and the adjustable voltage source 118 may be an on-device digital-to-analog (D/A) converter. In this example, the current drawn by the bipolar current source transistor can be controlled by selectively transmitting a digital signal to the D/A converter, so that an analog control voltage to the bipolar current source transistor can be adjusted. As another example, the adjustable voltage source 118 may be a voltage divider with adjustable resistors so that the voltage provided by the voltage divider is adjustable.

The optional adjustable resistor 114 of the output circuit 106, which is connected in series between the emitter of the driving transistor 112 and the output node 122, is a resistor whose resistance can be adjusted after fabrication. As an example, the adjustable resistor 114 may be a resistor that can be laser trimmed to change the resistance of the resistor. As another example, the adjustable resistor 114 may be a set of resistors that can be selectively shorted so that only some of the resistors will be in operation to change the total resistance of the connected resistors.

The configuration of the output circuit 106 allows the impedance of the output circuit to be adjusted after the fabrication of the IC device 102. The impedance of the output circuit 106 can be adjusted by changing the current drawn by the adjustable current source 116, which is controlled by the control voltage supplied to the adjustable current source 116 by the adjustable voltage source 118. The impedance of the output circuit 106 can also be adjusted by changing the resistance of the adjustable resistor 114. Since the impedance of the output circuit 106 affects voltage peaking of the output signal transmitted from the IC device 102 to the IC device 104, the voltage peaking can be at least partially controlled by selectively adjusting the impedance of the output circuit using the adjustable current source 116 and/or the adjustable resistor 114.

The input circuit 108 of the IC device 104 includes a pass transistor 126, a load capacitor 128, an optional adjustable resistor 130, an optional resistance-adjustable transistor 132, a switching device 134 and adjustable voltage sources 136 and 138. The pass transistor 126 is connected to an input node 140, which is connected to the electrical connection 110. Thus, the input node 140 of the input circuit 108 is connected to the output node 122 of the output circuit 122 via the electrical connection 110. In this embodiment, the pass transistor 126 is a FET. However, the pass transistor may be another type of transistor. The pass transistor 126 may be a sampling transistor that is selectively activated by a control signal supplied to the gate of the transistor to sample the output signal transmitted from the output circuit 106 of the IC device 102. The voltage of the control signal supplied to the gate of the pass transistor 126 can be adjusted after fabrication of the IC device 104 so that the on-resistance of the pass transistor can be changed. The control signal to the gate of the pass transistor 126 is provided by the adjustable voltage source 136 via the switching device 134, which is configured to selectively transmit the control signal based on an on_off signal, on_off, which may be a clock signal for sampling. In this embodiment, the switching device 134 includes complementary P-channel metal oxide semiconductor (PMOS) and N-channel metal oxide semiconductor (NMOS) transistors 142 and 144. The PMOS and NMOS transistors 142 and 144 are connected in series between the adjustable voltage source 136 and the low voltage terminal 124. The gates of the PMOS and NMOS transistors 142 and 144 are connected to receive the on_off signal, which selectively activates the PMOS transistor and deactivates the NMOS transistor to transmit the control signal to the gate of the pass transistor 126. Since the selective activation of the PMOS transistor connects the adjustable voltage source 136 to the gate of the pass transistor 126, the voltage provided by the adjustable voltage source 136 controls the voltage of the control signal on the gate of the pass transistor. The adjustable voltage source 136 may be an on-device digital-to-analog (D/A) converter or a voltage divider with adjustable resistors.

The load capacitor 128 of the input circuit 108 is connected between the pass transistor 126 and the low voltage terminal 124. The load capacitor 128 may represent parasitic circuit capacitance and/or intentionally added capacitance. The optional adjustable resistor 130 is connected in parallel to the load capacitor 128. Similar to the adjustable resistor 114 of the output circuit 106, the resistance of the adjustable resistor 130 can be adjusted after the fabrication of the IC device 104. The adjustable resistor 130 can be any type of resistor that can be resistance-adjusted after fabrication, such as a laser trimmable resistor. The optional resistance-adjustable transistor 132 is also connected in parallel to the load capacitor 128. In this embodiment, the resistance-adjustable resistor 132 is a FET. However, the resistance-adjustable resistor may be another type of transistor. The resistance-adjustable transistor 132 is operated in the linear region to function as an adjustable resistor. The gate of the resistance-adjustable transistor 132 is connected to the adjustable voltage source 138, which may be an on-device D/A converter or a voltage divider with adjustable resistors. The adjustable voltage source 138 provides a voltage, which can be adjusted after fabrication of the IC device 104, to the gate of the resistance-adjustable transistor 132 to adjust the on-resistance of the transistor. In order to operate the resistance-adjustable transistor 132 as an adjustable resistor, the drain-to-source voltage ($V_{ds}$) should be less than the difference between the gate-to-source voltage and the threshold voltage ($V_{gs}-V_{th}$). In an alternative configuration, the adjustable resistor 130 and/or the resistance-adjustable transistor 132 may be directly connected in parallel between the input node 140 and the low voltage terminal 124.

The configuration of the input circuit 108 allows the impedance of the input circuit to be adjusted after fabrication of the IC device 104. As an example, the impedance of the input circuit 108 can first be adjusted by adjusting the voltage of the adjustable voltage source 136 to adjust the voltage of the control signal supplied to the pass transistor 126. The impedance of the input circuit 108 can then be adjusted by adjusting the voltage supplied to the resistance-adjustable transistor 132 from the adjustable voltage source 138. The impedance of the input circuit 108 can then be further adjusted by changing the resistance of the adjustable resistor 130. Other sequences of adjustments can be made to the voltage of the control supplied to the pass transistor 126, the voltage supplied to the resistance-adjustable transistor 132 and the resistance of the adjustable resistor 130 to adjust the impedance of the input circuit 108. Since the impedance of the input circuit affects voltage peaking of the output signal transmitted from the IC device 102 to the IC device 104, the voltage peaking can be at least partially controlled by selectively adjusting the impedance of the input circuit 108 using the pass transistor 126, the adjustable resistor 130 and/or the resistance-adjustable transistor 132.

Figure 2:
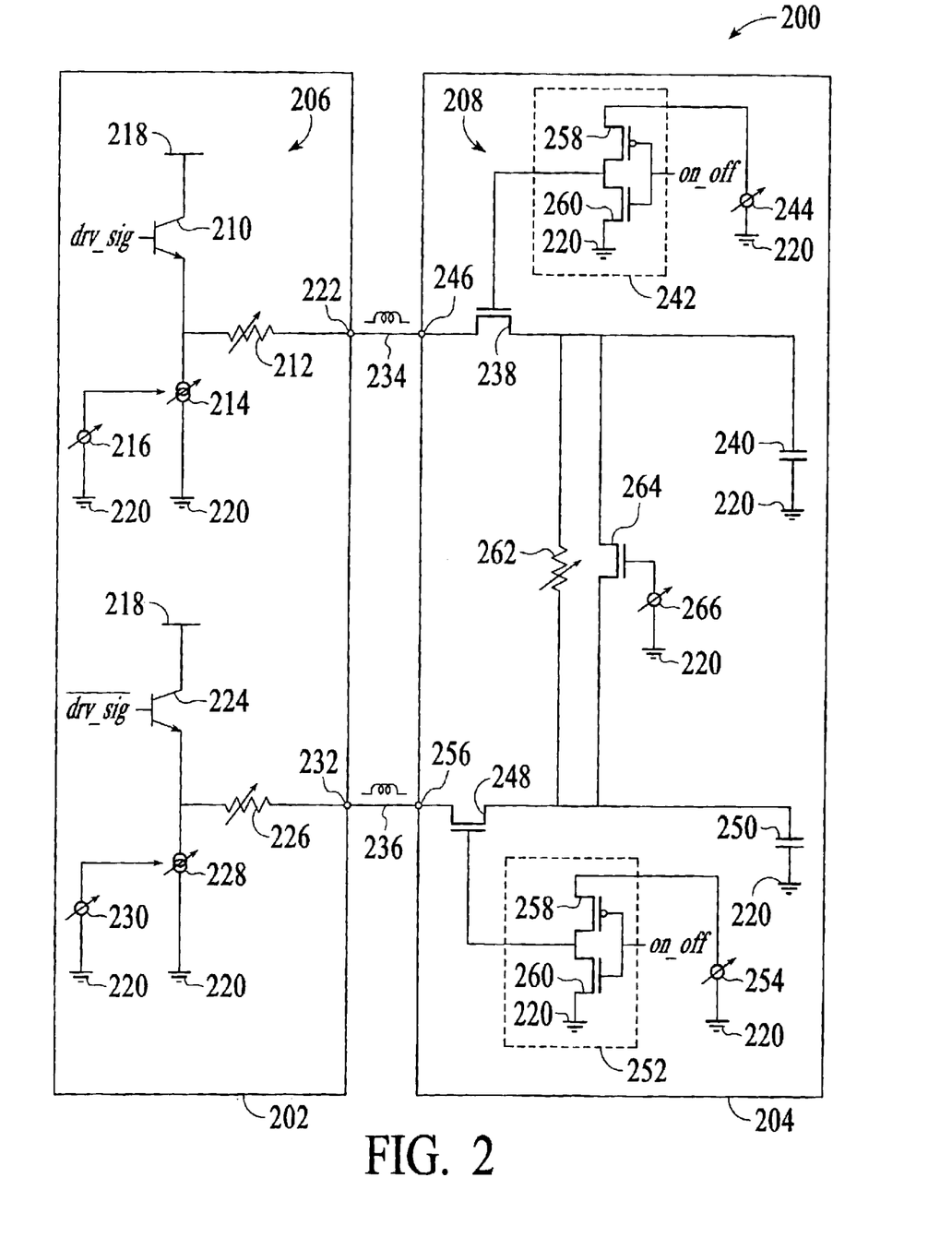
FIG. 2 is a diagram of a multi-device system in accordance with another embodiment of the invention.

Turning now to FIG. 2, a multi-device system 200 having an IC device 202 and an IC device 204 in accordance with another embodiment of the invention is shown. The multi-device system 200 of FIG. 2 is a differential version of the multi-device system 100 of FIG. 1. Thus, in this embodiment, the IC device 202 includes an output circuit 206 that is designed to transmit differential signals to an input circuit 208 of the IC device 204 to drive the input circuit. Similar to the multi-device system 100 of FIG. 1, the input and output circuits 206 and 208 are configured such that the impedance of the input and/or output circuit can be adjusted after fabrication of the IC devices 202 and 204 to control voltage peaking of the differential signals.

The output circuit 206 of the IC device 202 includes a driving transistor 210, an optional adjustable resistor 212, an adjustable current source 214 and an adjustable voltage source 216. These components are connected to a high voltage terminal 218, a low voltage terminal 220 (e.g., ground) and an output node 222 in the same configuration as the output circuit 106 of the multi-device system 100 of FIG. 1. The output circuit 206 further includes a driving transistor 224, an optional adjustable resistor 226, an adjustable current source 228 and an adjustable voltage source 230, which are similarly connected to the high voltage terminal 218, the low voltage terminal 220 and an output node 232. In other embodiments, the adjustable voltage sources 216 and 230 may be replaced by a single adjustable voltage source that provides a control voltage to both of the adjustable current sources 214 and 228.

The driving transistors 210 and 224 are configured to receive driving signals, drv_sig and $\overline{drv\_sig}$, which control (increase and decrease) the currents conducted through the driving transistors in an alternating fashion to transmit differential signals to the input circuit 208 of the IC device 204 via the output nodes 222 and 232. The output nodes 222 and 232 are connected to electrical connections 234 and 236, which connect the output circuit 206 of the IC device 202 and the input circuit 208 of the IC device 204. The electrical connections 234 and 236 may be bondwires and/or short ($\ell<<\lambda/4$) transmission lines.

Similar to the output circuit 106 of the multi-device system 100 of FIG. 1, the configuration of the output circuit 206 allows the impedance of the output circuit 206 to be adjusted after fabrication of the IC device 202. Thus, voltage peaking of the differential signals transmitted from the output circuit 206 to the input circuit 208 can be at least partially controlled by adjusting the impedance of the output circuit 206 using the adjustable current sources 214 and 228 and/or the optional adjustable resistors 212 and 226.

The input circuit 208 of the IC device 204 includes a pass transistor 238, a load capacitor 240, a switching device 242 and an adjustable voltage source 244. These components are connected in series between an input node 246 and the low voltage terminal 220 in the same configuration as the input circuit 108 of the multi-device system 100 of FIG. 1. The input node 246 is connected to the electrical connection 234. Thus, the input node 246 is electrically connected to the output node 222 of the output circuit 206 to receive one of the differential signals transmitted by the output circuit. The input circuit 208 further includes a pass transistor 248, a load capacitor 250, a switching device 252 and an adjustable voltage source 254, which are similarly connected in series between an input node 256 and the low voltage terminal 220. The input node 256 is connected to the electrical connection 236. Thus, the input node 256 is electrically connected to the output node 232 of the output circuit 206 to receive the other differential signal transmitted by the output circuit. The switching devices 242 and 252 are configured to receive an on_off signal, on_off, which may be a clock signal for sampling. The on_off signal selectively activates and deactivates the switching devices to transmit control signals to the pass transistors 238 and 248, which may be sampling transistors, based on the voltage provided by the adjustable voltage sources 244 and 254. In the illustrated embodiment, each switching device includes complementary PMOS and NMOS transistors 258 and 260, which are connected in series to the respective adjustable voltage source 244 or 254 and the low voltage terminal 220. The gates of the PMOS and NMOS transistors 258 and 260 are configured to receive the on_off signal, which selectively activates the PMOS transistor 258 and deactivates the NMOS transistor 260 so that one of the control signals are transmitted to the gate of the respective pass transistor 238 or 248. The control signals selectively activate the pass transistors 238 and 248 to, for example, sample the differential signals from the output circuit 206.

The input circuit 208 further includes an optional adjustable resistor 262 and an optional resistance-adjustable transistor 264, which are connected in parallel between the pass transistors 238 and 248. The resistance-adjustable transistor 264 is also connected to an adjustable voltage source 266. The adjustable voltage source 266 provides a control voltage to the resistance-adjustable transistor 264. The resistance-adjustable transistor 264 is operated in the linear region to function as an adjustable resistor whose resistance can be changed by adjusting the control voltage from the adjustable voltage source. The adjustable resistor 262 is a resistor whose resistance can be adjusted after fabrication of the IC device 204. In an alternative configuration, the adjustable resistor 262 and/or the resistance-adjustable transistor 264 may be directly connected in parallel between the input nodes 246 and 256.

Similar to the input circuit 108 of the multi-device system 100 of FIG. 1, the configuration of the input circuit 208 allows the impedance of the input circuit 208 to be adjusted after fabrication of the IC device 204. Thus, voltage peaking of the differential signals transmitted from the output circuit 206 of the IC device 202 can be at least be partially controlled by adjusting the impedance of the input circuit 208 using the pass transistors 238 and 248, the optional adjustable resistor 262 and/or the optional resistance-adjustable transistor 264.

Although the adjustable current sources 116, 214 and 228 of the input circuits 106 and 206 of the multi-device systems 100 and 200 have been described as being controlled by adjustable voltages, these adjustable current sources may instead be controlled by adjustable currents. Similarly, the pass transistors 126, 238 and 248 and the resistance-adjustable transistor 132 and 264 may be controlled by adjustable currents rather than adjustable voltages.

Figure 3:
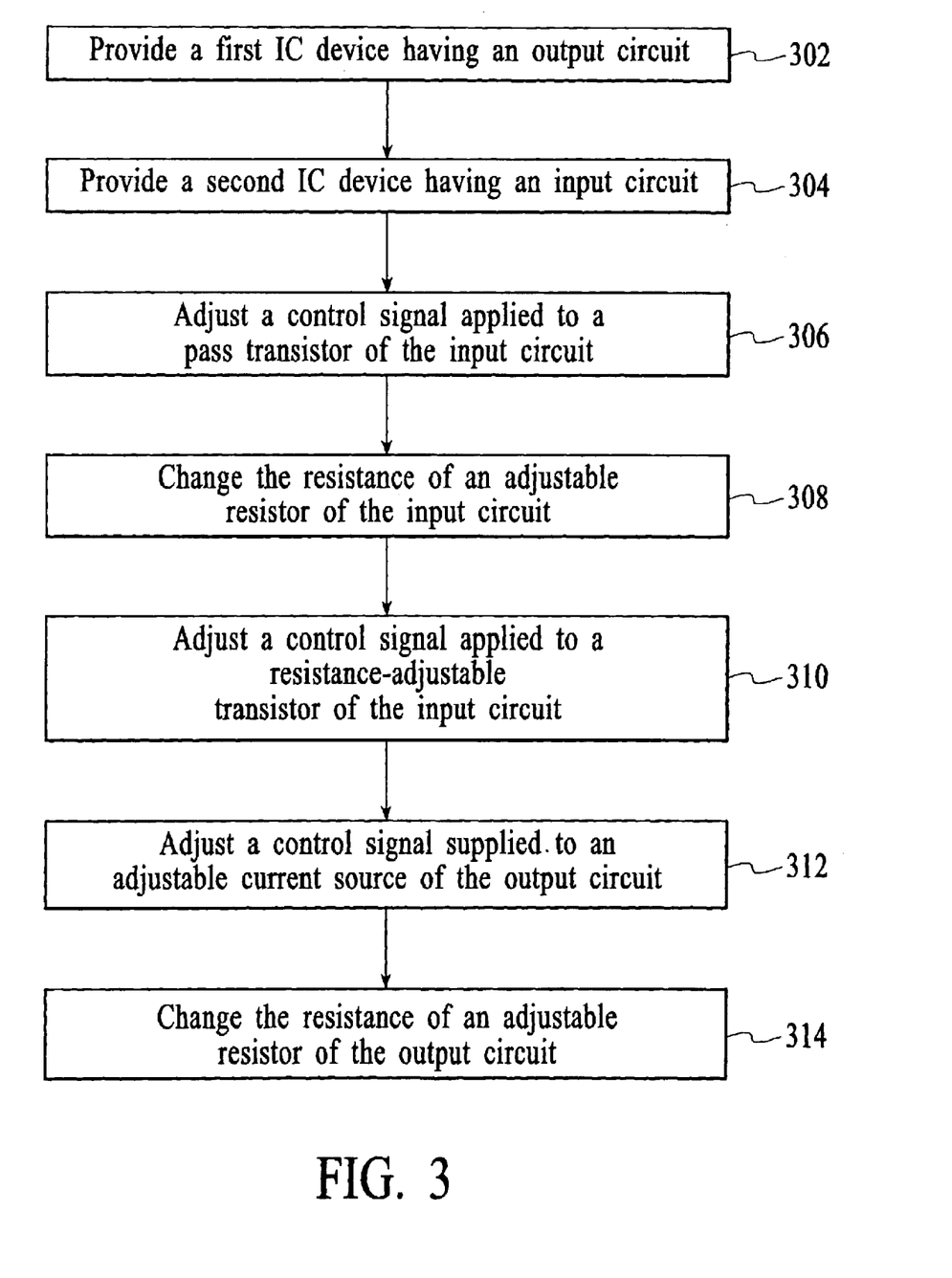
FIG. 3 is a flow diagram of a method of controlling voltage peaking in accordance with one embodiment of the invention.

A method of controlling voltage peaking of an output signal transmitted between IC devices in accordance with one embodiment of the invention is described with reference to a flow diagram of FIG. 3. At block 302, a first IC device having an output circuit is provided. As an example, the output circuit may be the output circuit 106 of the multi-device system 100 of FIG. 1 or the output circuit 206 of the multi-device system 200 of FIG. 2. At block 304, a second IC device having an input circuit is provided. As an example, the input circuit may be the input circuit 108 of the multi-device system 100 of FIG. 1 or the input circuit 206 of the multi-device system 200 of FIG. 2. At block 306, a control signal applied to a pass transistor of the input circuit is adjusted to change the on-resistance of the pass transistor. At optional block 308, the resistance of an adjustable resistor of the input circuit connected in series between the pass transistor and a low voltage terminal is changed. At optional block 310, a control signal applied to a resistance-adjustable transistor of the input circuit connected in series between the pass transistor and the low voltage terminal is adjusted to change the on-resistance of the transistor. At optional block 312, a control signal supplied to an adjustable current source of the output circuit connected in series with a driving transistor between a high voltage terminal and a low voltage terminal is adjusted to change the current drawn by the adjustable current source. At optional block 314, the resistance of an adjustable resistor of the output circuit connected in series between the driving transistor and an output node is changed. Performing blocks 306–314 adjust the impedance of the input circuit and/or the output circuit, which affects voltage peaking of an output signal transmitted from the output circuit to the input circuit. Thus, the voltage peaking of the output signal can be controlled by performing one or more of the blocks 306–314.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method of controlling voltage peaking of an output signal transmitted from an output circuit to an input circuit comprising:

providing said input circuit, said input circuit including a pass transistor connected in series between an input node and a low voltage terminal, said input node being connected to receive said output signal from said output circuit, said input circuit additionally including an adjustable resistor connected in series with said input node;

changing the resistance of said adjustable resistor of said input circuit; and adjusting a control signal applied to said pass transistor of said input circuit using an adjustable signal source to change the on-resistance of said pass transistor, said on-resistance of said pass transistor having a relationship with said voltage peaking of said output signal such that said voltage peaking can at least be partially controlled by changes in said on-resistance of said pass transistor.

2. An input circuit comprising:

an input node to receive a transmitted signal;

a pass transistor connected to said input node, said pass transistor including a control electrode to receive a control signal to selectively activate said pass transistor;

an adjustable signal source connected in series with said control electrode of said pass transistor, said adjustable signal source being configured to adjust said control signal to change the on-resistance of said pass transistor, thereby controlling voltage peaking of said transmitted signal; and an adjustable resistor connected in series with said input node.

3. The input circuit of claim 2 further comprising a switching device connected to said pass transistor and said adjustable signal source to selectively transmit said control signal based on an on_off signal.

4. The input circuit of claim 3 wherein said switching device includes complementary transistors that are connected in series between said adjustable voltage source and a low voltage terminal, said complementary transistors being controlled by said on_off signal to transmit said control signal to said pass transistor.

5. The input circuit of claim 2 further comprising a second input node, a second pass transistor connected to said second input node, and a second adjustable signal source connected in series with said second pass transistor, said second adjustable signal source being configured to adjust a second control signal applied to said second pass transistor to adjust the on-resistance of said second pass transistor.

6. A multi-device system comprising:

a first integrated circuit device including an output circuit configured to transmit an output signal; and a second integrated circuit device including an input circuit that is electrically connected to said output circuit, said input circuit including:

an input node connected to said output circuit to receive said output signal;

a pass transistor connected to said input node, said pass transistor including a control electrode to receive a control signal to selectively activate said pass transistor; and an adjustable signal source connected in series with said control electrode of said pass transistor, said adjustable signal source being configured to adjust said control signal to change the on-resistance of said pass transistor, thereby controlling voltage peaking of said output signals, wherein said output circuit includes a driving transistor, an adjustable current source and an adjustable signal source, said driving transistor and said adjustable current source being connected in series between a high voltage terminal and a low voltage terminal, said driving transistor being also connected to an output node to transmit said output signal to said input circuit, said adjustable signal source being configured to adjust a second signal supplied to said adjustable current source to adjust the current drawn by said adjustable current source.

7. The multi-device system of claim 6 wherein said output circuit further includes an adjustable resistor connected in series between said driving transistor and said output node.

8. A method of controlling voltage peaking of an output signal transmitted from an output circuit to an input circuit comprising:
providing said input circuit, said input circuit including a pass transistor connected in series between an input node and a low voltage terminal, said input node being connected to receive said output signal from said output circuit, said input circuit additionally including a resistance-adjustable transistor connected in series with said input node;
adjusting a control signal applied to said resistance-adjustable transistor of said input circuit to change the on-resistance of said resistance-adjustable transistor; and
adjusting a control signal applied to said pass transistor of said input circuit using an adjustable signal source to change the on-resistance of said pass transistor, said on-resistance of said pass transistor having a relationship with said voltage peaking of said output signal such that said voltage peaking can at least be partially controlled by changes in said on-resistance of said pass transistor.

9. A method of controlling voltage peaking of an output signal transmitted from an output circuit to an input circuit comprising:
providing said input circuit, said input circuit including a pass transistor connected in series between an input node and a low voltage terminal, said input node being connected to receive said output signal from said output circuit;
adjusting a control signal applied to said pass transistor of said input circuit using an adjustable signal source to change the on-resistance of said pass transistor, said on-resistance of said pass transistor having a relationship with said voltage peaking of said output signal such that said voltage peaking can at least be partially controlled by changes in said on-resistance of said pass transistor;
providing said output circuit including a driving transistor connected in series between a high voltage terminal and a low voltage terminal, said output circuit also including an adjustable resistor connected in series between said driving transistor and an output node, said output node being electrically connected to said input node of said input circuit to transmit said output signal to said input circuit; and
changing the resistance of said adjustable resistor of said output circuit.

10. The method of claim 7 wherein said providing of said output circuit includes providing said output circuit additionally including a second driving transistor connected in series between said high voltage terminal and said low voltage terminal, said output circuit also including a second adjustable resistor connected in series between said second driving transistor and a second output node, said output node and said second output node being used to transmit said output signal as differential signals to said input circuit, and further comprising changing the resistance of said second adjustable resistor of said output circuit.

11. A method of controlling voltage peaking of an output signal transmitted from an output circuit to an input circuit comprising:
providing said input circuit, said input circuit including a pass transistor connected in series between an input node and a low voltage terminal, said input node being connected to receive said output signal from said output circuit;
adjusting a control signal applied to said pass transistor of said input circuit using an adjustable signal source to change the on-resistance of said pass transistor, said on-resistance of said pass transistor having a relationship with said voltage peaking of said output signal such that said voltage peaking can at least be partially controlled by changes in said on-resistance of said pass transistor;
providing said output circuit, said output circuit including a driving transistor and an adjustable current source connected in series between a high voltage terminal and a low voltage terminal, said output circuit also including an output node connected to said driving transistor, said output node being electrically connected to said input node of said input circuit to transmit said output signal to said input circuit; and
adjusting a control signal voltage supplied to an adjustable current source of said output circuit to change the current drawn by said adjustable current source.

12. The method of claim 11 wherein said providing of said output circuit includes providing said output circuit additionally including a second driving transistor and a second adjustable current source connected in series between said high voltage terminal and said low voltage terminal, said output circuit also including a second output node connected to said second driving transistor, said output node and said second output node being used to transmit said output signal as differential signals to said input circuit, and further comprising adjusting a second control signal supplied to said second adjustable current source of said output circuit to change the current drawn by said second adjustable current source.

13. A method of controlling voltage peaking of an output signal transmitted from an output circuit to an input circuit comprising:
providing said input circuit, said input circuit including a pass transistor connected in series between an input node and a low voltage terminal, said input node being connected to receive said output signal from said output circuit, said input circuit additionally including a second pass transistor connected in series between a second input node and said low voltage terminal, said second input node being connected to said output circuit to receive said output signal from said output circuit as differential signals;
adjusting a control signal applied to said pass transistor of said input circuit using an adjustable signal source to change the on-resistance of said pass transistor, said on-resistance of said pass transistor having a relationship with said voltage peaking of said output signal such that said voltage peaking can at least be partially controlled by changes in said on-resistance of said pass transistor; and
adjusting a second control signal applied to said second pass transistor of said input circuit to change the on-resistance of said second pass transistor.

14. An input circuit comprising:

an input node to receive a transmitted signal;

a pass transistor connected to said input node, said pass transistor including a control electrode to receive a control signal to selectively activate said pass transistor;

an adjustable signal source connected in series with said control electrode of said pass transistor, said adjustable signal source being configured to adjust said control signal to change the on-resistance of said pass transistor, thereby controlling voltage peaking of said transmitted signal; and a resistance-adjustable transistor connected in series with said input node, said resistance-adjustable transistor being also connected to a second adjustable signal source to provide a second control signal to said resistance-adjustable transistor, said second adjustable signal source being configured such that said control signal can be adjusted to change the on-resistance of said resistance-adjustable transistor.

15. A multi-device system comprising:

a first integrated circuit device including an output circuit configured to transmit an output signal; and a second integrated circuit device including an input circuit that is electrically connected to said output circuit, said input circuit including:

an input node connected to said output circuit to receive said output signal;

a pass transistor connected to said input node, said pass transistor including a control electrode to receive a control signal to selectively activate said pass transistor;

an adjustable signal source connected in series with said control electrode of said pass transistor, said adjustable signal source being configured to adjust said control signal to change the on-resistance of said pass transistor, thereby controlling voltage peaking of said output signal; and an adjustable resistor connected in series with said input node.

16. A multi-device system comprising:

a first integrated circuit device including an output circuit configured to transmit an output signal; and a second integrated circuit device including an input circuit that is electrically connected to said output circuit, said input circuit including:

an input node connected to said output circuit to receive said output signal;

a pass transistor connected to said input node, said pass transistor including a control electrode to receive a control signal to selectively activate said pass transistor;

an adjustable signal source connected in series with said control electrode of said pass transistor, said adjustable signal source being configured to adjust said control signal to change the on-resistance of said pass transistor, thereby controlling voltage peaking of said output signal; and a resistance-adjustable transistor connected in series with said input node, said resistance-adjustable transistor being also connected to a second adjustable signal source to provide a second control signal to said resistance-adjustable transistor, said second adjustable signal source being configured such that said second control signal can be adjusted to change the on-resistance of said resistance-adjustable transistor.

17. A multi-device system comprising:

a first integrated circuit device including an output circuit configured to transmit an output signal; and a second integrated circuit device including an input circuit that is electrically connected to said output circuit, said input circuit including:

an input node connected to said output circuit to receive said output signal;

a pass transistor connected to said input node, said pass transistor including a control electrode to receive a control signal to selectively activate said pass transistor; and an adjustable signal source connected in series with said control electrode of said pass transistor, said adjustable signal source being configured to adjust said control signal to change the on-resistance of said pass transistor, thereby controlling voltage peaking of said output signal, wherein said output circuit is configured to transmit said output signal as differential signals and wherein said input circuit is configured to receive said differential signals, said input circuit further including a second input node, a second pass transistor connected to said second input node, and a second adjustable signal source connected in series with said second pass transistor, said second adjustable signal source being configured to adjust a second control signal applied to said second pass transistor to adjust the on-resistance of said second pass transistor.

* * * * *

UNITED STATES PATENT AND TRADEMARK OFFICE
CERTIFICATE OF CORRECTION

PATENT NO. : 6,956,402 B2
DATED : October 18, 2005
INVENTOR(S) : Wuppermann

It is certified that error appears in the above-identified patent and that said Letters Patent is hereby corrected as shown below:

<u>Column 8,</u>
Line 64, delete "signals," and insert -- signal, --.

<u>Column 9,</u>
Line 61, delete "claim 7" and insert -- claim 9 --.

Signed and Sealed this

Fourteenth Day of February, 2006

JON W. DUDAS
*Director of the United States Patent and Trademark Office*